(12) United States Patent
Tamura et al.

(10) Patent No.: US 7,271,225 B2
(45) Date of Patent: Sep. 18, 2007

(54) PHOSPHORUS-CONTAINING EPOXY RESIN, PHOSPHORUS-CONTAINING EPOXY RESIN COMPOSITION, PROCESS FOR PRODUCING THE RESIN, SEALANT CONTAINING THE COMPOSITION, MOLDING MATERIAL CONTAINING THE COMPOSITION, AND LAMINATE CONTAINING THE COMPOSITION

(75) Inventors: Ken Tamura, Tokyo (JP); Yoshifusa Hara, Tokyo (JP)

(73) Assignee: Nippon Chemical Industrial Co., Ltd., Koto-ku (JP)

( * ) Notice: Subject to any disclaimer, the term of this patent is extended or adjusted under 35 U.S.C. 154(b) by 471 days.

(21) Appl. No.: 10/515,764

(22) PCT Filed: May 29, 2002

(86) PCT No.: PCT/JP02/05206

§ 371 (c)(1),
(2), (4) Date: Nov. 24, 2004

(87) PCT Pub. No.: WO03/099900

PCT Pub. Date: Dec. 4, 2003

(65) Prior Publication Data

US 2005/0228148 A1    Oct. 13, 2005

(51) Int. Cl.

| B32B 27/38 | (2006.01) |
|---|---|
| C08G 59/14 | (2006.01) |
| C08L 63/00 | (2006.01) |
| C08L 63/02 | (2006.01) |
| C08L 63/04 | (2006.01) |

(52) U.S. Cl. ............... 525/523; 428/413; 525/481; 525/533; 528/108

(58) Field of Classification Search ............... None
See application file for complete search history.

(56) References Cited

U.S. PATENT DOCUMENTS 4,345,059 A    8/1982    Fretz, Jr. et al.
7,109,286 B2 *  9/2006    Tamura et al. ............ 528/99

FOREIGN PATENT DOCUMENTS

| EP | 1300409 A | 4/2003 |
|---|---|---|
| JP | 51-143620 A | 12/1976 |
| JP | 55-122790 A * | 9/1980 |
| JP | 57-195141 A | 11/1982 |
| JP | 58-198521 A | 11/1983 |
| JP | 63-95223 A | 4/1988 |
| JP | 63-156860 A | 6/1988 |
| JP | 2-269730 A | 11/1990 |
| JP | 2-272014 A | 11/1990 |
| JP | 3-84025 A | 4/1991 |
| JP | 5-25369 A | 2/1993 |
| JP | 11-166035 A | 6/1999 |
| JP | 11-279258 A | 10/1999 |
| JP | 2002-241466 A | 8/2002 |
| JP | 2003-192763 A * | 7/2003 |
| JP | 2003-192768 A * | 7/2003 |
| JP | 2003-327837 A * | 11/2003 |
| WO | WO 02/00667 A | 1/2002 |

OTHER PUBLICATIONS

HCAPLUS accession No. 2002:10486 for PCT Publication No. WO 02/000667 and U.S. Patent No. 7,109,286, Tamura et al., Jan. 3, 2002, three pages.*

* cited by examiner

Primary Examiner—Robert Sellers
(74) Attorney, Agent, or Firm—Smith Patent Office

(57) ABSTRACT

A phosphorus-containing epoxy resin has a structural unit derived from a secondary phosphine derivative represented by the following formula:

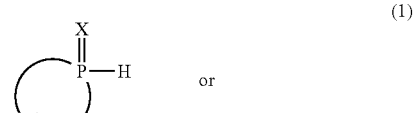

(1)

or

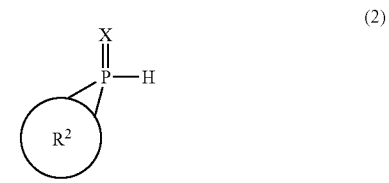
(2)

wherein $R^1$ represents an alkylene group that may have a substituent, $R^2$ represents a cycloalkylene or arylene group that may have a substituent, and X represents an oxygen or sulfur atom.

13 Claims, No Drawings

PHOSPHORUS-CONTAINING EPOXY RESIN, PHOSPHORUS-CONTAINING EPOXY RESIN COMPOSITION, PROCESS FOR PRODUCING THE RESIN, SEALANT CONTAINING THE COMPOSITION, MOLDING MATERIAL CONTAINING THE COMPOSITION, AND LAMINATE CONTAINING THE COMPOSITION

BACKGROUND OF THE INVENTION

1. Field of the Invention

The present invention relates to a phosphorus-containing epoxy resin, contained in various materials such as casting compounds, adhesives, and electrical insulating paint, having high flame retardancy; a phosphorus-containing epoxy resin composition, containing the resin, having high flame retardancy; a process for producing the resin; a sealant, used for manufacturing electrical components, containing the composition; a molding material containing the composition; and a laminate, such as a copper clad laminate included in printed wiring boards or electric circuit boards, containing the composition.

2. Description of the Related Art

Epoxy resins are used in various applications such as electronic components, electrical devices, automotive components, FRPs, and sporting goods because of the superior adhesion, heat resistance, and moldability. Copper clad laminates and sealants for such electronic components and electrical devices contain a flame retardant such as a halide or an antimony compound. However, the halide and antimony compound are harmful to human bodies. Therefore, an environmentally friendly flame retardant has been demanded.

Up to now, in order to render epoxy resins flame-retardant, the following techniques have been proposed: a technique in which an epoxy resin is blended with an additive flame retardant, a technique in which an epoxy resin is reformed by chemically bonding a reactive flame retardant to the epoxy resin, and the like.

Examples of the technique using the additive flame retardant include, for example, a technique, disclosed in Japanese Unexamined Patent Application Publication No. 5-25369, using hydrated alumina; a technique, disclosed in Japanese Unexamined Patent Application Publication No. 58-198521, using surface-treated red phosphorus, hydrated alumina, and/or silica powder; and a technique, disclosed in Japanese Unexamined Patent Application Publication No. 63-156860, using modified red phosphorus.

When molding materials contain the additive flame retardant, the moldability thereof is inferior because a large amount the flame retardant must be contained.

On the other hand, in the case of the reactive flame retardant, the content of the flame retardant may be low. Therefore, various techniques using the reactive flame retardant have been proposed.

Examples of such techniques include a technique, disclosed in Japanese Unexamined Patent Application Publication No. 57-195141, using tris(hydroxypropyl)-phosphine oxide; a technique, disclosed in Japanese Unexamined Patent Application Publication No. 63-95223, using a phosphine oxide derivative; a technique, disclosed in Japanese Unexamined Patent Application Publication Nos. 11-279258 and 11-166035, using an organic phosphorus compound; and a technique, disclosed in Japanese Unexamined Patent Application Publication Nos. 51-143620, 3-84025, 2-272014, and 2-269730, using epoxy phosphate prepared by allowing phosphonic acid to react with epichlorohydrin or a polyepoxy compound having an epoxy group. The phosphine oxide derivative is represented by the following formula (3):

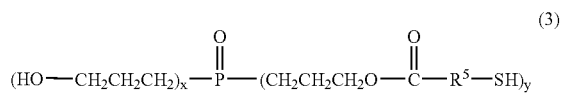

wherein $R^5$ represents a methylene or ethylene group, x represents an integer of 0 to 2, y represents an integer of 1 to 3, and x+y=3. The organic phosphorus compound is represented by the following formula:

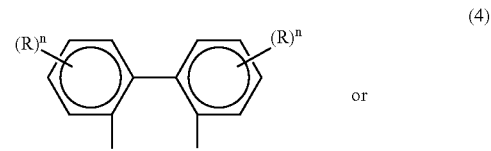

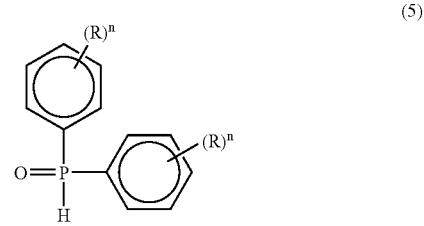

wherein R represents an alkyl group with one to six carbon atoms and n represents an integer of 0 to 4.

A technique using a phosphorus-containing compound, which functions as a reactive flame retardant, is disclosed in Japanese Unexamined Patent Application Publication No. 2000-80251. This compound is represented by the following formula (6):

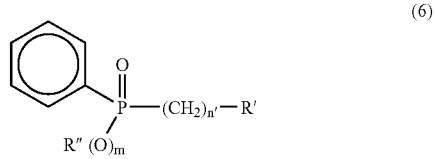

wherein R' represents a group with two or more phenolic hydroxyl groups; n' represents an integer of 0 to 3; R" represents a linear or branched alkyl group, cyclohexyl group, cyclopentyl group, or aryl group with one to eight carbon atoms or a alkyl- or alkoxy-substituted alkyl or aryl group with one to 18 carbon atoms and may have a ring containing a P atom; and m is 0 or 1. Various phosphorus-containing compounds functioning as a reactive flame retardant are disclosed in this publication; however, a compound with the phosphorus-oxygen (P—O) bond only has flame retardancy in actual.

As described above, the various techniques for rendering the epoxy resin flame-retardant have been proposed. However, in the techniques using the reactive flame retardant, there are the following problems: the phosphorus content per unit weight in the epoxy resin cannot be sufficiently increased to exert the flame retardancy, and the flame retardancy cannot be enhanced even if a sufficient amount of phosphorus is added to the epoxy resin.

Most of known organic phosphorus compounds contained in the flame retardants for the epoxy resin have the P—O bond. Therefore, there is a problem in that such compounds are hydrolyzed. In particular, there is a problem in that electrical properties of electrical parts are deteriorated due to eluted phosphoric acid produced by the decomposition of an organic phosphorus compound when the electrical parts contain the epoxy resin, functioning as a flame retardant, having the P—O bond.

SUMMARY OF THE INVENTION

The inventors have found that the above problems can be solved by allowing an epoxy resin to have a structural unit derived from a secondary phosphine derivative represented by formula (1) or (2) described below, whereby the present invention has been completed.

Accordingly, it is an object of the present invention to provide a phosphorus-containing epoxy resin having high flame retardancy; a process for producing the resin in an industrially advantageous manner; a phosphorus-containing epoxy resin composition, containing the resin, having high flame retardancy and chemical resistance; a sealant containing the composition; a molding material containing the composition; and a laminate containing the resin.

A first aspect of the present invention provides a phosphorus-containing epoxy resin having a structural unit derived from a secondary phosphine derivative represented by the following formula:

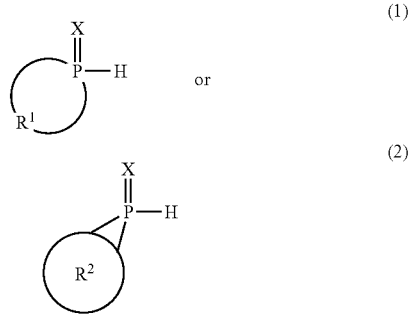

wherein $R^1$ represents an alkylene group that may have a substituent, $R^2$ represents a cycloalkylene or arylene group that may have a substituent, and X represents an oxygen or sulfur atom.

The secondary phosphine derivative is preferably at least one selected from 1,4-cyclooctylenephosphine oxide and 1,5-cyclooctylenephosphine oxide.

The phosphorus-containing epoxy resin is preferably obtained by allowing the secondary phosphine derivative to react with an epoxy or polyepoxy compound.

The content of phosphorus in the resin is preferably 0.1 percent to 10 percent by weight.

A second aspect of the present invention provides a phosphorus-containing epoxy resin composition containing the phosphorus-containing epoxy resin and a curing agent or a polymerization initiator.

A third aspect of the present invention provides a process for producing the phosphorus-containing epoxy resin including a step of allowing an epoxy or polyepoxy compound to react with a secondary phosphine derivative represented by the above formula (1) or (2).

A fourth aspect of the present invention provides a sealant containing the phosphorus-containing epoxy resin composition.

A fifth aspect of the present invention provides a molding material containing the phosphorus-containing epoxy resin composition.

A sixth aspect of the present invention provides a laminate containing the phosphorus-containing epoxy resin composition.

The phosphorus-containing epoxy resin of the present invention has superior flame retardancy and can be produced by an industrially advantageous process.

The phosphorus-containing epoxy resin composition of the present invention has superior flame retardancy and chemical resistance. Therefore, the composition is useful for manufacturing flame-retardant sealants, molding compounds, casting compounds, adhesives, and electrical insulating paint for copper clad laminates and electrical components included in printed wiring boards or electric circuit boards.

DESCRIPTION OF THE PREFERRED EMBODIMENTS

The present invention will now be described in detail.

A phosphorus-containing epoxy resin provided by the present invention has a structural unit derived from a secondary phosphine derivative represented by the following formula:

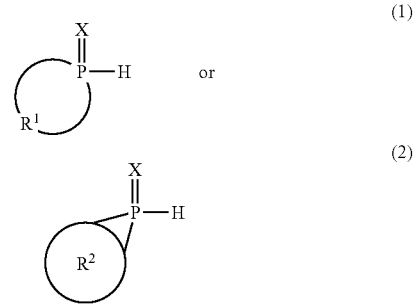

In formula (1), $R^1$ represents an alkylene group that may have a substituent.

The alkylene group has three to nine carbon atoms and preferably four to six carbon atoms. Examples of the alkylene group include a propylene group, a butylene group, a pentamethylene group, a hexamethylene group, a heptamethylene group, an octamethylene group, and a nonamethylene group. Examples of the substituent include a phenyl group, an alkoxy group, a cyano group, and a hydroxyl group.

In formula (2), $R^2$ represents a cycloalkylene or arylene group that may have a substituent.

The cycloalkylene group has four to nine carbon atoms and preferably five to seven carbon atoms. Examples of the cycloalkylene group include a cyclobutylene group, a cyclopentamethylene group, a cyclohexamethylene group, a cycloheptamethylene group, a cyclooctylene group, and a cyclononylene group.

Examples of the arylene group include a phenylene group and a naphthylene group. Examples of the substituent of the cycloalkylene or arylene group include a phenyl group, an alkoxy group, a cyano group, and a hydroxyl group.

Those substituents may contain a hetero atom such as oxygen, sulfur, or nitrogen.

In formulae (1) and (2), X represents an oxygen or sulfur atom and preferably an oxygen atom.

Examples of the secondary phosphine derivative include 1,3-cyclopentylenephosphine oxide, 1,4-cyclooctylenephosphine oxide, 1,5-cyclooctylenephosphine oxide, and 1,5-cyclooctylenephosphine sulfide. In the present invention, 1,4-cyclooctylenephosphine oxide and 1,5-cyclooctylenephosphine oxide are particularly preferable.

In the present invention, the above compounds may be used alone or in combination.

The secondary phosphine derivative can be produced by a known process. An example of cycloalkylenephosphine oxides having a ring consisting of a phosphorus atom and the group represented by $R^1$ or $R^2$ can be prepared according to the following procedure: phosphine represented by formula (7) is allowed to react with 1,5-cyclooctadiene represented by formula (8) in the presence of a radical catalyst, whereby a mixture of 1,4-cyclooctylenephosphine represented by formula (9) and 1,5-cyclooctylenephosphine represented by formula (10) is obtained; and the mixture obtained is then oxidized, whereby a mixture of 1,4-cyclooctylenephosphine oxide and 1,5-cyclooctylenephosphine oxide is prepared. The reaction of phosphine with 1,5-cyclooctadiene is disclosed in Japanese Unexamined Patent Application Publication No. 55-122790 and is expressed as follows:

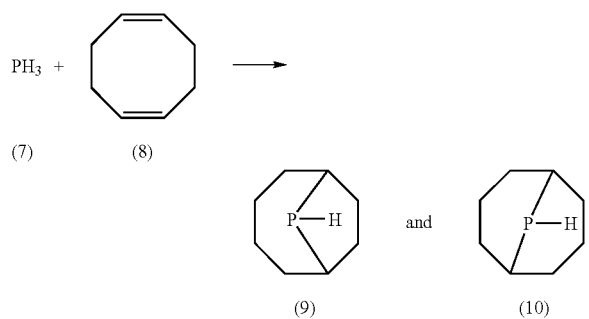

The phosphorus-containing epoxy resin of the present invention has the structural unit derived from the secondary phosphine derivative as described above. The structural unit is defined as a reactive residue derived from the secondary phosphine derivative. The reactive residue is chemically bonded to an epoxy group of an epoxy or polyepoxy compound by allowing the epoxy group to react with active hydrogen directly bonded to phosphorus contained in the secondary phosphine derivative.

In the reactive residue, phosphorus is directly bonded to the alkylene group, cycloalkylene group, or arylene group represented by $R^1$ or $R^2$ to form the P—C covalent bond. Therefore, the reactive residue does not deteriorate electrical properties of devices, in contrast to other organic phosphorus compounds that have the P—O bond and are therefore decomposed to produce phosphoric acid, which is eluted. Furthermore, the reactive residue provides superior advantages such as chemical resistance.

In the present invention, in order to achieve high flame retardancy, the content of phosphorus in the phosphorus-containing epoxy resin is 0.1 percent to 10 percent by weight and preferably 2 percent to 8 percent by weight. When the phosphorus content is less than 0.1 percent by weight, the flame retardancy is insufficient. In contrast, when the phosphorus content is more than 10 percent by weight, the resin is inferior in properties such as heat resistance and moisture resistance because the resin cured has low crosslink density.

The structural unit can be formed by allowing an epoxy or polyepoxy compound to react with at least one selected from the secondary phosphine derivative represented by formula (1) and the secondary phosphine derivative represented by formula (2).

The epoxy or polyepoxy compound is a monomer, oligomer, or polymer having at least two epoxy groups. Examples of the epoxy or polyepoxy compound include a bisphenol-A epoxy resin, a bisphenol-F epoxy resin, a bisphenol-S epoxy resin, a phenol novolac epoxy resin, a cresol novolac epoxy resin, a naphthalene epoxy resin, a biphenyl epoxy resin, and N-glycidyl compounds such as N,N'-diglycidyl aniline, triglycidyl isocyanurate, and N,N,N',N'-tetraglycidyl-bis(p-aminophenyl)-methane. The N-glycidyl compounds are obtained by the reaction of aromatic amine with heterocyclic nitrogen base. The epoxy or polyepoxy compound is not limited to those compounds and resins. The compounds and resins may be used alone or in combination.

The epoxy or polyepoxy compound used herein may be saturated or unsaturated and may be aliphatic, cycloaliphatic, aromatic, or heterocyclic. The epoxy or polyepoxy compound may have a substituent such as an alkyl group, aryl group, or ether group that does not cause a side reaction, which interferes with a main reaction or mixing operation. A mixture of different epoxy or polyepoxy compounds may be used. The epoxy or polyepoxy compound may have a number-average molecular weight Mn of about 9,000 or less and about 150 to 4,000 in general.

The epoxy or polyepoxy compound is polyglycidyl ether or polyglycidyl ester derived from polyhydric alcohol or phenol and preferably derived from a dihydric alcohol, a dihydric phenol, a compound obtained by hydrogenating such a dihydric phenol, or a novolac resin. The novolac resin is produced by allowing monohydric or polyhydric phenol to react with aldehyde. The monohydric or polyhydric phenol is preferably phenol or cresol, and the aldehyde is preferably formaldehyde. The epoxy or polyepoxy compound can be prepared by a known method and obtained by allowing, for example, polyol to react with epichlorohydrin.

Preferable examples of the dihydric phenol include resorcinol, hydroquinone, 2,2'-bis(4-hydroxyphenyl)propane (generally referred to as bisphenol-A), a mixture of dihydroxydiphenylmethane isomers (generally referred to as bisphenol-F isomers), 4,4'-dihydroxydiphenylcyclohexane, 4,4'-dihydroxy-3,3'-dimethyldiphenylpropane, 4,4'-dihydroxybiphenyl, 4,4'-dihydroxydibenzophenone, 1,1'-bis(4-hydroxyphenyl)ethane, 1,1'-bis(4-hydroxyphenyl)isobutane, 2,2'-bis(4-hydroxy-tert-butylphenyl)propane, bis(2-hydroxynaphthyl)methane, 1,5-dihidroxynaphthalene, tris(4-hydroxyphenyl)methane, and 1,1'-bis(4-hydroxyphenyl) ether. In the present invention, bisphenol-A and bisphenol-F are preferably used.

Preferable examples of the polyepoxy compound further include polyglycidyl ether of an aliphatic polyhydric alcohol. Examples of such a polyhydric alcohol include 1,4-butanediol, 1,6-hexanediol, polyalkylene glycol, glycerol, trimethylol propane, neopentyl glycol, 2,2'-bis(4-hydroxycyclohexyl)propane, and pentaerithritol.

Preferable examples of the polyepoxy compound further include polyglycidyl ester, which can be obtained by allowing epichlorohydrin or a similar epoxy compound to react with an aliphatic, cycloaliphatic, or aromatic polycarboxylic acid such as oxalic acid, adipic acid, glutaric acid, phthalic acid, isophthalic acid, terephthalic acid, tetrahydrophthalic acid, hexahydrophthalic acid, 2,6-naphthalene dicarboxylic acid, or an aliphatic acid dimer. Examples of polyglycidyl ester include diglycidyl terephthalate and diglycidyl hexahydrophthalate.

A polymerizable olefinic unsaturated compound having an epoxy group can be advantageously used in some cases. Such a compound can be prepared by allowing glycidyl ester of acrylic acid or methacrylic acid to react with vinyl acetate or styrene by an emulsion polymerization process.

Examples of the epoxy or polyepoxy compound further include heterocyclic compounds such as a hydantoin epoxy resin, triglycidyl isocyanurate, an oligomer of triglycidyl isocyanurate, triglycidyl-p-aminophenol, triglycidyl-p-aminodiphenyl ether, tetraglycidyldiaminodiphenylmethane, tetraglycidyldiaminodiphenyl ether, tetrakis(4-glycidyloxyphenyl)ethane, urazole epoxide, uracil epoxide, and an oxazolidinone-modified epoxy resin.

Examples of the epoxy or polyepoxy compound further include compounds derived from aromatic amines such as aniline. Examples of such compounds include N,N'-diglycidylaniline, diaminodiphenylmethane, N,N'-dimethylaminodiphenylmethane, and N,N'-dimethylaminodiphenylsulfone.

Other preferable examples of the epoxy or polyepoxy compound are disclosed in Henry Lee and Kris Neville *Handbook of Epoxy Resins*, McGraw-Hill Book Company, 1967; Henry Lee *Epoxy Resins*, American Chemical Society, 1970; Wagner/Sarx *Lackkunstharze*, Carl Hanser Verlag, 1971, 5th edition, 174 ff.; *Angew. Markomol. Chemie*, Vol. 44, 1975, pp. 151-163; German Published Patent Application No. 2757733; and European Published Patent Application No. 0384939.

Furthermore, preferable examples of the epoxy or polyepoxy compound include bisglycidyl ether derived from bisphenol-A, bisphenol-F, or bisphenol-F, that is, a product of the reaction of one of these bisphenols with epihalohydrin, for example, epichlorohydrin; an oligomer of such ether; polyglycidyl ether of a phenol-formaldehyde and/or cresol-formaldehyde novolac resin; diglycidyl ester of phthalic acid, isophthalic acid, terephthalic acid, tetrahydrophthalic acid, hexahydrophthalic acid, or trimellitic acid; a N-glycidyl compound of aromatic amine or heterocyclic nitrogen base; and a diglycidyl or polyglycidyl compound of aliphatic polyhydric alcohol such as 1,4-butanediol, trimethylol propane, or polyalkylene glycol. Examples of the N-glycidyl compound include N,N'-diglycidylaniline, N,N,O-triglycidyl-p-aminophenol, triglycidyl isocyanurate, N,N,N',N'-tetraglycidyl-bis(p-aminophenyl)methane, a hydantoin epoxy resin, and an arachidic epoxy resin.

Preferable examples of the epoxy or polyepoxy compound further include oxazolidinone-modified epoxy resins, which are disclosed in *Angew. Markomol. Chemie*, Vol. 44, 1975, pp. 151-163. A preferable example of such resins is a product obtained by allowing bisphenol-A diglycidyl ether to react with diphenylmethane diisocyanate in the presence of an appropriate promoter.

The amount of the secondary phosphine derivative is preferably 0.51 to 104.3 parts by weight with respect to 100 parts by weight of the epoxy or polyepoxy compound when the derivative is 1,4-cyclooctylenephosphine oxide. According to the above blending ratio, the content of phosphorus in the phosphorus-containing epoxy resin obtained is 0.1 percent to 10 percent by weight.

The reaction temperature is usually −10° C. to 200° C. and preferably 70° C. to 150° C.

The reaction may be performed in the presence of a catalyst according to needs. Examples of the catalyst include tertiary amines such as benzylmethylamine; ammonium salts such as tetramethylammonium chloride; phosphines such as triphenylenephosphine and tris(2,6-dimethoxypheyl)phosphine; phosphonium salts such as ethyltriphenylphosphonium bromide; and imidazoles such as 2-methylimidazole and 2-ethyl-4-methylimidazole. These compounds may be used alone or in combination.

In the reaction, a solvent may be used according to needs. Examples of the solvent include aliphatic hydrocarbons such as hexane; aromatic hydrocarbons such as benzene, toluene, and xylene; nitrites such as acetonitrile and propionitrile; aromatic hydrocarbon halides such as chlorobenzene; haloalkanes such as methylene chloride and chloroform; tetrahydrofuran; dioxane; dialkyl ether; and glycol ether. These compounds may be used alone or in combination.

The phosphorus-containing epoxy resin obtained as described above usually has an epoxy equivalent of 100 to 1,000 g/eq and preferably 200 to 500 g/eq. The phosphorus-containing epoxy resin usually has a phosphorus content of 0.1 percent to 10 percent by weight and preferably 2 percent to 8 percent by weight.

The phosphorus-containing epoxy resin can be cured by chain polymerization using a polymerization initiator or by a successive polymerization using a curing agent. The cured phosphorus-containing epoxy resin has high flame retardancy.

A phosphorus-containing epoxy resin composition of the present invention contains the phosphorus-containing epoxy resin and the curing agent or polymerization initiator.

The polymerization initiator is not particularly limited and any polymerization initiator that can polymerize the phosphorus-containing epoxy resin may be used. Examples of the polymerization initiator include cation polymerization initiators such as methansulfonic acid, aluminum chloride, tin chloride, a boron trifluoride-ethylamine complex, and boron trifluoride etherate; radical polymerization initiators such as benzoyl peroxide and azobisisobutyronitrile; and anion polymerization initiators such as potassium methylate, triethylamine, and 2-dimethylaminophenol. These compounds may be used alone or in combination.

The curing agent is not particularly limited and any curing agent known for persons skilled in the art may be used. Examples of the curing agent include linear aliphatic diamines, such as ethylenediamine, trimethylenediamine, tetramethylenediamine, hexamethylenediamine, having two to 20 carbon atoms; amines such as m-phenylenediamine, p-phenylenediamine, p-xylenediamine, 4,4'-diaminodiphenylmethane, 4,4'-diaminodiphenylpropane, 4,4'-diaminodiphenyl ether, 4,4'-diaminodiphenyl sulfone, 4,4'-diaminodicyclohexane, bis(4-aminophenyl)phenylmethane, 1,5-diaminonaphthalene, m-xylylenediamine, p-xylylenediamine, 1,1-bis(4-aminophenyl)cyclohexane, and dicyandiamide; phenol novolac resins such as a cresol novolac resin, a tert-butylphenol novolac resin, a nonylphenol novolac resin, and a triazine-modified novolac resin; phenol resol resins; poly(oxystyrenes) such as poly(p-oxystyrene); phenol resins obtained by the copolymerization of a carbonyl compound and a phenol compound such as a phenol aralkyl resin or naphthol aralkyl resin having an aromatic ring, such as a benzene ring or naphthalene ring, of which hydrogen is substituted by an hydroxy group; and acid anhydrides such as pyromellitic dianhydride, trimellite anhydride, and maleic anhydride. These compounds may be used alone or in combination.

The amount of the polymerization initiator is usually 0.1 percent to 10 percent by mole with respect to the phosphorus-containing epoxy resin and preferably 0.5 percent to 2 percent by mole. The amount of the polymerization initiator is preferably determined depending on the epoxy equivalent of the resin.

In the polymerization reaction using the curing agent, a catalyst may be used according to needs.

Examples of the catalyst include tertiary amine compounds such as 1,8-diaza-bicyclo(5,4,0)undecene-7, triethylenediamine, and benzyldimethylamine; imidazole compounds such as 2-methylimidazole, 2-ethyl-4-methylimidazole, 2-phethylimidazole, and 2-phethyl-4-methylimidazole; organic phosphine compounds such as triphenylphosphine and tributylphosphine; phosphonium salts; and ammonium salts. These compounds may be used alone or in combination.

In the polymerization reaction, an additional epoxy or polyepoxy compound may be used in combination with the epoxy or polyepoxy compound described above. The additional epoxy or polyepoxy compound is a monomer, oligomer, or polymer each having at least two epoxy groups. Examples of the additional epoxy or polyepoxy compound are the same as those of the former epoxy or polyepoxy compound and include a bisphenol-A epoxy resin; a bisphenol-F epoxy resin; a bisphenol-S epoxy resin; a phenol novolac epoxy resin; a cresol novolac epoxy resin; a naphthalene epoxy resin; a biphenyl epoxy resin; and N-glycidyl compounds, such as N,N'-diglycidyl aniline, triglycidyl isocyanurate, and N,N,N',N'-tetraglycidyl-bis(p-aminophenyl)methane, derived from aromatic amine and heterocyclic nitrogen base. The additional epoxy polyepoxy compound is not limited to these resins and compounds, which may be used alone or in combination.

The blend ratio of these epoxy or polyepoxy compounds is not particularly limited, and these compounds may be blended such that the phosphorus content in the phosphorus-containing epoxy resin is 0.1 percent to 10 percent by weight and preferably 2 percent to 8 percent by weight.

The flame-retardant phosphorus-containing epoxy resin composition of the present invention may further contain a flame retardant, a curing accelerator, inorganic filler, a silane-coupling agent, a releasing agent, a coloring agent, a stress release agent, and a surfactant.

Examples of the flame retardant include hydrated metal oxides, phosphorus flame retardants, and nitrogen-containing flame retardants.

The hydrated metal oxides are compounds having extinguishing properties due to an endothermic reaction or double salts containing such a compound. The compounds are represented by the formula $M_mO_n \cdot xH_2O$, wherein M represents a metal, m and n each represents an integer that is greater than or equal to 1 and determined depending on the valence of the metal, and x represents the number of moles of crystallization water. Examples of the hydrated metal oxides include aluminum hydroxide, magnesium hydroxide, basic magnesium carbonate, calcium hydroxide, barium hydroxide, zirconium hydroxide, dawsonite, zinc stannate, zinc borate, aluminum borate, antimony pentoxide, basic zinc carbonate, cobalt oxide, zirconium oxide, tin oxide, aluminum oxide, titanium oxide, magnesium oxide, calcium silicate, borax, zinc molybdate, zinc phosphate, magnesium phosphate, hydrotalcite, hydrocalumite, kaolin, talc, sericite, pyrophillite, bentonite, kaolinite, calcium sulfate, and zinc sulfate.

Examples of the nitrogen-containing flame retardants include melamine derivatives such as melamine, melamine cyanurate, methylated melamine, melam, melem, melon, succinoguanamine, melamine sulfate, acetoguanamine sulfate, melam sulfate, guanylmelamine sulfate, a melamine resin, a BT resin, cyanuric acid, isocyanuric acid, an isocyanuric derivative, melamine isocyanurate, benzoguanamine, and acetoguanamine; and guanidine compounds. A reaction mixture obtained by the condensation of a triazine compound, phenol compound, and aldehyde compound can be used for the nitrogen-containing flame retardants.

Examples of the phosphorus flame retardants include triethyl phosphate, tricresyl phosphate, triphenyl phosphate, cresyl phenyl phosphate, octyl diphenyl phosphate, ethyl diethylphosphate, butyl bis(hydroxypropyl)phosphate, disodium ethylphosphate, methylphosphonic acid, dimethyl methylphosphate, diethyl methylphosphate, ethylphosphonic acid, propylphosphonic acid, butylphosphonic acid, 2-methyl-propylphosphonic acid, t-butylphosphonic acid, 2,3-dimethylbutylphosphonic acid, octylphosphonic acid, phenylphosphonic acid, dioctyl phenylphosphonate, dimethylphosphinic acid, methylethylphosphinic acid, methylpropylphosphinic acid, diethylphosphinic acid, dioctylphosphinic acid, phenylphosphinic acid, ethylphenylphosphinic acid, diphenylphosphinic acid, bis(4-methoxyphenyl)phosphinic acid, red phosphorus, ammonium phosphate, ammonium polyphosphate, melamine phosphate, guanylurea phosphate, melamine polyphosphate, guanidine phosphate, ethylenediamine phosphonate, phosphazene, and melamine methylphosphonate.

The above compounds functioning as a flame retardant may be used alone or in combination. Derivatives of the compounds may also be used.

Examples of the inorganic filler include fused silica powder, crystalline silica powder, alumina, silicon nitride, aluminum nitride, boron nitride, magnesia, titanium oxide, calcium carbonate, magnesium carbonate, talc, calcium silicate, glass fibers, asbestos, barium sulfate, and E-glass fine powder. These materials may be used alone or in combination. Examples of the curing accelerator include tertiary amine compounds such as 1,8-diaza-bicyclo(5,4,0)undecene-7, triethylenediamine, and benzyldimethylamine; imidazole compounds such as 2-methylimidazole, 2-ethyl-4-methylimidazole, 2-phethylimidazole, and 2-phethyl-4-methylimidazole; organic phosphine compounds such as triphenylphosphine and tributylphosphine; phosphonium salts; and ammonium salts. These compounds may be used alone or in combination.

Examples of the silane-coupling agent include epoxysilanes such as γ-glycidoxypropyl trimethoxysilane and aminosilanes such as N-phenyl-γ-aminopropyl trimethoxysilane.

Examples of the releasing agent include aliphatic acids such as stearic acid, montanoic acid, palmitic acid, oleic acid, and linoleic acid; salts of such aliphatic acids that contain calcium, magnesium, aluminum, or zinc; amides of the aliphatic acids; phosphoric esters; polyethylene; bisamide; polyolefins with a carboxyl group; and natural carnauba wax. These materials may be used alone or in combination.

Examples of the coloring agent include carbon black and titanium oxide.

Examples of the stress release agent include silicone gel, silicone rubber, and silicone oil.

Examples of the surfactant include polyethylene glycol-aliphatic acid esters, sorbitan-aliphatic acid esters, and aliphatic acid monoglycerides.

The flame-retardant phosphorus-containing epoxy resin composition of the present invention is a safe plastic material. Therefore, the composition can be used for sealants, molding compounds, casting compounds, adhesives, and electrical insulating paint for electrical components and also used for copper clad laminates included in printed wiring boards or electric circuit boards.

The phosphorus-containing epoxy resin composition contains the phosphorus-containing epoxy resin and the curing agent or polymerization initiator and is used in an uncured, semi-cured, or cured state. The composition may be processed into tablets, films, semi-cured bodies, cured bodies, melt, varnish, or solutions.

When the phosphorus-containing epoxy resin composition is used as a sealing material, the composition is preferably in a uniformly mixed or kneaded state. The sealing material is manufactured according to the following procedure: the composition is kneaded at an elevated temperature with, for example, a roller, kneader, or mixer and the resulting composition is cooled, crushed, and then formed into tablets.

Semiconductor devices having high flame retardancy, moisture resistance, and electrical reliability can be prepared by sealing semiconductor elements and/or lead frames by a transfer molding process using the sealing material described above. A molding process is not particularly limited except for the use of the sealing material, and an ordinary process can be used.

The phosphorus-containing epoxy resin composition can be formed into resin varnish by dissolving the composition in a solvent. The solvent used is preferably aprotic. Examples of the solvent include N,N'-dimethylformamide; ethers such as diethyl ether, tetrahydrofuran, dioxane, ether obtained by allowing ethylglycol to react with monoalcohol having a linear or branched alkyl group with one to six carbon atoms, propylene glycol ether, and butyl glycol ether; ketones such as acetone, methyl ethyl ketone, methyl isopropyl ketone, methyl isobutyl ketone, and cyclohexanone; esters ethyl acetate, butyl acetate, ethylene glycol acetate, and methoxypropyl acetate; methoxypropanol; hydrocarbon halides; and cycloaliphatic or aromatic hydrocarbons. Among these compounds, N,N'-dimethylformamide, methyl ethyl ketone, toluene, and xylene are preferable. These compounds may be used alone or in combination.

In the present invention, the solvent used in the polymerization reaction may be allowed to remain in the reaction mixture, whereby resin varnish may be prepared. The resin varnish obtained can be used for preparing prepregs, and the preparing procedure is as follows: the resin varnish is applied onto base materials such as paper sheets, glass fabric sheets, glass nonwoven fabric sheets, or fabric sheets-containing a component other than glass, whereby the base materials are impregnated with the resin varnish; and the resulting base materials are dried at 80° C. to 200° C. in a drying furnace. A predetermined number of the prepregs obtained are stacked, heated, and then pressed, whereby a laminate is prepared. In the same manner as the above, a metal clad laminate for printed wiring boards can be prepared. Furthermore, the resin varnish can be used as an interlayer-insulating adhesive for bonding multilayer printed wiring boards together. In such an application, the resin varnish is applied onto an anchor face of a copper thin film and the resulting film is then dried at 80° C. to 130° C. such that the solvent does not remain in the varnish.

The phosphorus-containing epoxy resin composition of the present invention may be mixed with an ordinary component such as a hardener or rubber, whereby a flame-retardant adhesive agent or a flame-retardant adhesive film is prepared.

EXAMPLES

The present invention will now be described in detail with examples; however, the present invention is not limited to these examples.

Example 1

Into a reactor, 1,843 g (16.69 mol) of 1,5-cyclooctadiene manufactured by Tokyo Kasei Kogyo Co., Ltd. and 3,750 ml of toluene were fed, and an atmosphere in the resulting reactor was fully replaced with nitrogen. Into the resulting reactor, 731 g (21.50 mol) of phosphine manufactured by Nippon Chemical Industrial Co., Ltd. was fed, and the resulting reactor was heated to 60° C. Into the resulting reactor, 58.8 g (0.237 mol) of 2,2-azobis-(2,4-dimethylvaleronitrile), manufactured by Japan Hydrazine Company Inc., functioning as a radical initiator was injected with a pressure while three hours were spent. The mixture was maintained at 60° C. and left overnight, thereby obtaining a toluene solution containing a mixture of 1,4-cyclooctylenephosphine and 1,5-cyclooctylenephosphine. The solution was analyzed by gas chromatography. The analysis showed that the content of the mixture in the solution was 31.9 percent by weight and the ratio of 1,4-cyclooctylenephosphine to 1,5-cyclooctylenephosphine was 38.4 to 61.6. The isomer ratio was determined based on the area ratio of the isomers.

A 2,000-ml four-neck flask equipped with an agitator, a condenser, and a dropping funnel was prepared and an atmosphere in the flask was fully replaced with nitrogen. Into the flask, 434.6 g (0.975 mol) of the solution obtained by the above reaction was fed at room temperature. Furthermore, 440 g of methanol was fed into the resulting flask, which was then cooled to about 5° C. in an ice bath. Into the resulting flask, 106.5 g (1.05 mol) of aqueous hydrogen peroxide was dropped through the funnel while three hours were spent. The termination of reaction was determined by a gas chromatographic method. After the oxidation reaction was terminated, the reaction mixture was concentrated using a rotary evaporator, thereby obtaining 152.8 g (0.996 mol) of a mixture of 1,4-cyclooctylenephosphine oxide and 1,5-cyclooctylenephosphine oxide, the mixture being colorless and crystalline. The mixture was analyzed by NMR. The analysis showed that the ratio of 1,4-cyclooctylenephosphine oxide to 1,5-cyclooctylenephosphine oxide was 39.4 to 60.6. The isomer ratio was determined based on the area ratio of the isomers.

Example 2

Into a reactor, 120.0 g of an o-cresol novolac epoxy resin (Epototo YDCN-701, manufactured by Tohto Kasei Co., Ltd., having an epoxy equivalent of 200.2 g/eq) was fed, and the reactor was then heated to 120° C. Into the resulting reactor, 22.72 g of the mixture, prepared in Example 1, containing 1,4-cyclooctylenephosphine oxide and 1,5-cyclooctylenephosphine oxide was fed. Subsequently, 0.047 g of triphenylphosphine functioning as a catalyst was fed into the reactor while the mixture in the reactor was agitated, and the reactor was then heated to 150° C. After 30 minutes, a transparent melt was produced in the reactor. Agitation was further continued for eight hours and the reactor was then cooled, whereby a white solid was obtained. The solid was mashed in a mortar, whereby 141.8 g of white powder was obtained. The white powder was a phosphorus-containing epoxy resin (hereinafter referred to as resin A) having an epoxy equivalent of 311.2 g/eq and a phosphorus content of 3.1 percent by weight.

In the same manner as the above, resin A used in other examples was further prepared.

$^{31}$P NMR (121.5 MHz, CDCl$_3$): σ 46.62 (S), 73.13 (S)

IR (KBr, cm$^{-1}$): 3214 (OH Group), 3048 (Aromatic C—H Bond), 2915 (C—H Bond), 1212 (Aromatic C—O—C Bond)

Example 3

Into a reactor, 30.45 g of a phenol novolac epoxy resin (Epototo YDPN-638, manufactured by Tohto Kasei Co., Ltd., having an epoxy equivalent of 178.2 g/eq) was fed, and the reactor was then heated to 80° C. Into the resulting reactor, 6.08 g of the mixture, prepared in Example 1, containing 1,4-cyclooctylenephosphine oxide and 1,5-cyclooctylenephosphine oxide was fed. Subsequently, 0.024 g of triphenylphosphine functioning as a catalyst was fed into the reactor while the mixture in the reactor was agitated, and the reactor was then heated to 150° C. After 30 minutes, a transparent melt was produced in the reactor. Agitation was further continued for eight hours and the reactor was then cooled, whereby a white solid was obtained. The solid was mashed in a mortar, whereby 35.7 g of white powder was obtained. The white powder was a phosphorus-containing epoxy resin (hereinafter referred to as resin B) having an epoxy equivalent of 281.6 g/eq and a phosphorus content of 3.2 percent by weight.

In the same manner as the above, resin B used in other examples was further prepared.

$^{31}$P NMR (121.5 MHz, CDCl$_3$): σ 46.87 (S), 73.35 (S)

IR (KBr, cm$^{-1}$): 3261 (OH Group), 3058 (Aromatic C—H Bond), 2920 (C—H Bond), 1240 (Aromatic C—O—C Bond)

Example 4

Into a reactor, 40.02 g of an o-cresol novolac epoxy resin (Epototo YDCN-701, manufactured by Tohto Kasei Co., Ltd., having an epoxy equivalent of 200.2 g/eq) and 25.80 g of a bisphenol-A epoxy resin (Epototo YD-128, manufactured by Tohto Kasei Co., Ltd., having an epoxy equivalent of 186.6 g/eq) were fed, and the reactor was then heated to 120° C. Into the resulting reactor, 11.42 g of the mixture, prepared in Example 1, containing 1,4-cyclooctylenephosphine oxide and 1,5-cyclooctylenephosphine oxide was fed. Subsequently, 0.024 g of triphenylphosphine functioning as a catalyst was fed into the reactor while the mixture in the reactor was agitated, and the reactor was then heated to 150° C. After 30 minutes, a transparent melt was produced in the reactor. Agitation was further continued for eight hours and the reactor was then cooled, whereby a white solid was obtained. The solid was mashed in a mortar, whereby 76.5 g of white powder was obtained. The white powder was a phosphorus-containing epoxy resin (hereinafter referred to as resin C) having an epoxy equivalent of 293.8 g/eq and a phosphorus content of 2.8 percent by weight.

In the same manner as the above, resin C used in other examples was further prepared.

$^{31}$P NMR (121.5 MHz, CDCl$_3$): σ 46.91 (S), 73.50 (S)

IR (KBr, cm$^{-1}$): 3211 (OH Group), 3053 (Aromatic C—H Bond), 2921 (C—H Bond), 1250 (Aromatic C—O—C Bond)

Example 5

Into a reactor, 57.00 g of a phenol novolac epoxy resin (Epototo YDPN-638, manufactured by Tohto Kasei Co., Ltd., having an epoxy equivalent of 178.2 g/eq) was fed, and the reactor was then heated to 80° C. Into the resulting reactor, 4.68 g of the mixture, prepared in Example 1, containing 1,4-cyclooctylenephosphine oxide and 1,5-cyclooctylenephosphine oxide was fed. Subsequently, 0.024 g of triphenylphosphine functioning as a catalyst was fed into the reactor while the mixture in the reactor was agitated, and the reactor was then heated to 150° C. After 30 minutes, a transparent melt was produced in the reactor. Agitation was further continued for eight hours and the reactor was then cooled, whereby a white solid was obtained. The solid was mashed in a mortar, whereby 61.0 g of white powder was obtained. The white powder was a phosphorus-containing epoxy resin (hereinafter referred to as resin D) having an epoxy equivalent of 213.5 g/eq and a phosphorus content of 1.4 percent by weight.

In the same manner as the above, resin D used in other examples was further prepared.

$^{31}$P NMR (121.5 MHz, CDCl$_3$): σ 46.98 (S), 73.46 (S)

IR (KBr, cm$^{-1}$): 3261 (OH Group), 3058 (Aromatic C—H Bond), 2920 (C—H Bond), 1240 (Aromatic C—O—C Bond)

Example 6

Into a reactor, 50.80 g of a bisphenol-A epoxy resin (Epototo YD-128, manufactured by Tohto Kasei Co., Ltd., having an epoxy equivalent of 186.6 g/eq) was fed, and the reactor was then heated to 80° C. Into the resulting reactor, 11.69 g of the mixture, prepared in Example 1, containing 1,4-cyclooctylenephosphine oxide and 1,5-cyclooctylenephosphine oxide was fed. Subsequently, 0.023 g of triphenylphosphine functioning as a catalyst was fed into the reactor while the mixture in the reactor was agitated, and the reactor was then heated to 150° C. After 30 minutes, a transparent melt was produced in the reactor. Agitation was further continued for eight hours and the reactor was then cooled, whereby a white solid was obtained. The solid was mashed in a mortar, whereby 61.6 g of white powder was obtained. The white powder was a phosphorus-containing epoxy resin (hereinafter referred to as resin E) having an epoxy equivalent of 330.8 g/eq and a phosphorus content of 3.6 percent by weight.

In the same manner as the above, resin E used in other examples was further prepared.

$^{31}$P NMR (121.5 MHz, CDCl$_3$): σ 46.69 (S), 73.00 (S)

IR (KBr, cm$^{-1}$): 3265 (OH Group), 3056 (Aromatic C—H Bond), 2924 (C—H Bond), 1247 (Aromatic C—O—C Bond)

Table 1 shows the ingredients used in the above examples.

TABLE 1

Phosphorus-containing Epoxy Resin

| Resins | Examples | Epoxy Resins | Secondary Phosphine Derivatives (Flame Retardants) | Catalyst |
|---|---|---|---|---|
| A | 1 | 120.0 g of Epototo YDCN-701 | 22.72 g of Mixture of 1,4-cyclooctylenephosphine oxide and 1,5-cyclooctylenephosphine oxide | 0.047 g of triphenyl phosphine |

TABLE 1-continued

Phosphorus-containing Epoxy Resin

| Resins | Examples | Epoxy Resins | Secondary Phosphine Derivatives (Flame Retardants) | Catalyst |
|---|---|---|---|---|
| B | 2 | 30.45 g of Epototo YDPN-638 | 6.08 g of Mixture of 1,4-cyclooctylenephosphine oxide and 1,5-cyclooctylenephosphine oxide | 0.024 g of triphenyl phosphine |
| C | 3 | 40.02 g of Epototo YDCN-701 and 25.80 g of Epototo YD-128 | 11.42 g of Mixture of 1,4-cyclooctylenephosphine oxide and 1,5-cyclooctylenephosphine oxide | 0.024 g of triphenyl phosphine |
| D | 4 | 57.00 g of Epototo YDPN-638 | 4.68 g of Mixture of 1,4-cyclooctylenephosphine oxide and 1,5-cyclooctylenephosphine oxide | 0.024 g of triphenyl phosphine |
| E | 5 | 50.80 g of Epototo YD-128 | 11.69 g of Mixture of 1,4-cyclooctylenephosphine oxide and 1,5-cyclooctylenephosphine oxide | 0.023 g of triphenyl phosphine |

Example 7

A powdery phosphorus-containing epoxy resin composition was prepared by mixing 5.0 g of resin B prepared in Example 3, 0.19 g of dicyandiamide functioning as a curing agent, and 0.05 g of 2-ethyl-4-methylimidazole functioning as a curing accelerator.

Example 8

The following resin and compounds were fully mixed: 100.0 g of resin B prepared in Example 3, 3.8 g of dicyandiamide functioning as a curing agent, and 0.05 g of 2-ethyl-4-methylimidazole functioning as a curing accelerator. The mixture was placed in a Teflon™ mold having dimensions of 200 mm×200 mm×2 mm and then cured at 180° C. for five hours in a drying oven, whereby a cured body made of a phosphorus-containing epoxy resin was obtained. The cured body was machined into test pieces having a length of 127 mm, a width of 12.7 mm, and a thickness of 2 mm. One of the test pieces were analyzed by a DSC method. The analysis showed that the test piece had a glass transition point of 149.6° C.

Example 9

A liquid phosphorus-containing epoxy resin composition was prepared by mixing 5.03 g of resin B prepared in Example 3, 2.08 g of a bisphenol-A epoxy resin (Epototo YD-128, manufactured by Tohto Kasei Co., Ltd., having an epoxy equivalent of 186.6 g/eq), 0.30 g of dicyandiamide functioning as a curing agent, and 0.04 g of 2-ethyl-4-methylimidazole functioning as a curing accelerator.

Example 10

The following resin and compounds were fully mixed: 100.6 g of resin B prepared in Example 3, 41.6 g of a bisphenol-A epoxy resin (Epototo YD-128, manufactured by Tohto Kasei Co., Ltd., having an epoxy equivalent of 186.6 g/eq), 6.0 g of dicyandiamide functioning as a curing agent, and 0.04 g of 2-ethyl-4-methylimidazole functioning as a curing accelerator. The mixture was placed in a Teflon™ mold having dimensions of 200 mm×200 mm×2 mm and then cured at 180° C. for five hours in a drying oven, whereby a cured body made of a phosphorus-containing epoxy resin was obtained. The cured body was machined into test pieces having a length of 127 mm, a width of 12.7 mm, and a thickness of 2 mm. One of the test pieces were analyzed by a DSC method. The analysis showed that the test piece had a glass transition point of 146.4° C.

Example 11

Resin varnish was prepared by dissolving the following resin and compounds in 72 g of a solvent mixture of N,N-dimethylformamide and methyl ethyl ketone: 70.1 g of resin A prepared in Example 2, 2.2 g of dicyandiamide functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for ten minutes in a hot air-circulating oven, whereby prepregs having a resin content of 42.6 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 167.6° C.

Example 12

Resin varnish was prepared by dissolving the following resin and compounds in 83 g of a solvent mixture of N,N-dimethylformamide and methyl ethyl ketone: 50.0 g of resin A prepared in Example 2, 30.0 g of a bisphenol-A epoxy resin (Epototo YD-128, manufactured by Tohto Kasei Co., Ltd., having an epoxy equivalent of 186.6 g/eq), 3.38 g of dicyandiamide functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for six minutes in a hot air-circulating oven, whereby prepregs having a resin content of 44.0 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 174.8° C.

Example 13

Resin varnish was prepared by dissolving the following resin and compounds in 83 g of a solvent mixture of N,N-dimethylformamide and methyl ethyl ketone: 49.8 g of resin A prepared in Example 2, 10.1 g of a bisphenol-A epoxy resin (Epototo YD-128, manufactured by Tohto Kasei Co., Ltd., having an epoxy equivalent of 186.6 g/eq), 22.4 g of a novolac phenol resin (PSM-4261, manufactured by Gun Ei Chemical Industry Co., Ltd., having a hydroxyl equivalent of 104 to 106 g/eq) functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for seven minutes in a hot air-circulating oven, whereby prepregs having a resin content of 46.2 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 161.2° C.

Example 14

Resin varnish was prepared by dissolving the following resin and compounds in 93 g of a solvent mixture of N,N-dimethylformamide and methyl ethyl ketone: 70.0 g of resin A prepared in Example 2, 23.8 g of a novolac phenol resin (PSM-4261, manufactured by Gun Ei Chemical Industry Co., Ltd., having a hydroxyl equivalent of 104 to 106 g/eq) functioning as a curing agent, and 0.05 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for seven minutes in a hot air-circulating oven, whereby prepregs having a resin content of 46.7 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 163.5° C.

Example 15

Resin varnish was prepared by dissolving the following resin and compounds in 73 g of a solvent mixture of N,N-dimethylformamide and methyl ethyl ketone: 70.3 g of resin C prepared in Example 4, 2.6 g of dicyandiamide functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for ten minutes in a hot air-circulating oven, whereby prepregs having a resin content of 40.0 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 135.2° C.

Example 16

Resin varnish was prepared by dissolving the following resin and compounds in 72 g of a solvent mixture of N,N-dimethylformamide and methyl ethyl ketone: 68.1 g of resin D prepared in Example 5, 3.5 g of dicyandiamide functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for ten minutes in a hot air-circulating oven, whereby prepregs having a resin content of 42.1 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 151.0° C.

Example 17

Resin varnish was prepared by dissolving the following resin and compounds in 87 g of a solvent mixture of N,N-dimethylformamide and methyl ethyl ketone: 49.2 g of resin D prepared in Example 5, 31.0 g of a bisphenol-A epoxy resin (Epototo YD-128, manufactured by Tohto Kasei Co., Ltd., having an epoxy equivalent of 186.6 g/eq), 5.2 g of dicyandiamide functioning as a curing agent, and 0.04 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for ten minutes in a hot air-circulating oven, whereby prepregs having a resin content of 42.7 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 152.8° C.

Example 18

Resin varnish was prepared by dissolving the following resin and compounds in 68 g of a solvent mixture of N,N-dimethylformamide and methyl ethyl ketone: 34.2 g of resin E prepared in Example 6, 30.8 g of an o-cresol novolac epoxy resin (Epototo YDCN-701, manufactured by Tohto Kasei Co., Ltd., having an epoxy equivalent of 200.2 g/eq), 2.7 g of dicyandiamide functioning as a curing agent, and 0.05 g of 2-ethyl-4-methylimidazole functioning as a curing accelerator. Sheets of glass cloth (WEA 7628, manufactured by Nitto Boseki Co., Ltd., having a thickness of 0.18 mm) were impregnated with the obtained resin varnish. The resulting sheets were dried at 150° C. for ten minutes in a hot air-circulating oven, whereby prepregs having a resin content of 49.7 percent by weight were prepared. Eight of the obtained prepregs were stacked, and the stacked prepregs were hot-pressed at 170° C. for two hours with a force of 40 kgf/cm$^2$, whereby a laminate was prepared. The laminate was analyzed by a TMA method. The analysis showed that the laminate had a glass transition point of 119.4° C.

Comparative Example 1

The following resin and compound were mixed: 300 g of a bisphenol-A epoxy resin (Epikote 828, manufactured by Yuka Shell Epoxy KK, having an epoxy equivalent of 184 to 194 g/eq) and 53 g of m-xylylenediamine functioning as a curing agent. Furthermore, 10 percent by weight of tricresyl phosphate with respect to the amount of the above mixture was added to the mixture. The resulting mixture was cured at room temperature for three hours and then cured at 100° C. for two hours, whereby an epoxy resin-based cured body was obtained.

Flame Retardant Test

The cured bodies prepared in Examples 8 and 10 were machined into test pieces having a length of 125 mm, a width of 13 mm, and a thickness of 2 mm. The laminates prepared in Examples 11 to 18 were machined into test pieces having a length of 125 mm, a width of 13 mm, and a thickness of 1.5 mm. In order to evaluate the flame retardancy, these test pieces were subjected to the UL-94 vertical flame test, which has three classifications: 94V-0, 94V-1, and 94V-2. Test results are shown in Table 2.

TABLE 2

Results of Flame Retardant Test

| Examples | Phosphorus Content (percent by weight) | Glass Transition Point (° C.) | UL-94 |
|---|---|---|---|
| 7 | 3.0 | 149.6 | V-0 |
| 9 | 2.1 | 146.4 | V-0 |
| 10 | 1.3 | 167.6 | V-0 |
| 11 | 0.8 | 174.8 | V-0 |
| 12 | 0.8 | 161.2 | V-0 |
| 13 | 1.0 | 163.5 | V-0 |
| 14 | 1.1 | 135.2 | V-0 |
| 15 | 0.5 | 151.0 | V-1 |
| 16 | 0.3 | 152.8 | V-1 |
| 17 | 0.9 | 119.4 | V-0 |

Chemical Resistance Test

The two cured bodies prepared in Example 8 and Comparative Example 1 were investigated for the chemical resistance according to method JIS K 7114.

The cured bodies were each machined into five disk-shaped test pieces having a diameter of 50 mm and a thickness of 2 mm. The test pieces were immersed in sulfuric acid having a concentration of 10 percent by weight at 23° C. for seven days. The resulting test pieces were sufficiently washed with water, dried at 90° C. for one day under a reduced pressure, and then investigated for the weight and appearance.

The test result showed that the test pieces of Example 8 were reduced in weight by 1.5 percent on average and were not changed in appearance. In contrast, the test pieces of Comparative Example 1 were reduced in weight by 10 percent or more on average and had whitish appearance, the test pieces being prepared using resin Epikote 828 and tricresyl phosphate as described above. This difference is probably due to the following fact: the cured body of Example 7 contains phosphorus atoms that are each directly bound to corresponding carbon atoms to form P—C bonds, which are stable, and therefore has high chemical resistance; however, the cured body of Comparative Example 1 contains phosphorus atoms that are each indirectly bound to corresponding carbon atoms with corresponding oxygen atoms placed therebetween to form P—O—C bonds, which are readily hydrolyzed, and therefore has inferior chemical resistance because phosphoric acid is eluted from the cured body. Therefore, in the test pieces of Comparative Example 1, the weight was seriously reduced and the appearance became whitish.

Example 19

The following resin and compounds were mixed at room temperature with a mixer: 180.4 parts by weight of the phosphorus-containing epoxy resin prepared in Example 2, 61.50 parts by weight of a novolac phenol resin (PSM-4261, manufactured by Gun Ei Chemical Industry Co., Ltd.), 2.26 parts by weight of triphenylphosphine manufactured by Hokko Chemical Industry Co., Ltd., 1.13 parts by weight of OP wax manufactured by Hoechst Marion Russell, 1.13 parts by weight of carbon black manufactured by Mitsubishi Chemical Corporation, and 820.0 parts by weight of fused silica (Silstar M2430, manufactured by Nippon Chemical Industrial Co., Ltd.). The mixture was kneaded at 80° C. to 85° C. for seven minutes with a hot twin-screw roll. The resulting mixture was peeled off from the roll, cooled, and then crushed, whereby an epoxy resin sealant was prepared.

An 80-pin flat package having the following chip thereon was prepared by a transfer molding process using the sealant: a test silicon chip, equipped with aluminum wires having a width of 10 µm and a thickness of 1 µm, having dimensions of 6 mm×6 mm×0.4 mm. The flat package had external dimensions of 19 mm×14 mm×2.7 mm.

Example 20

The following resin and compounds were mixed at room temperature with a mixer: 163.3 parts by weight of the phosphorus-containing epoxy resin prepared in Example 3, 61.50 parts by weight of a novolac phenol resin (PSM-4261 manufactured by Gun Ei Chemical Industry Co., Ltd.), 2.26 parts by weight of triphenylphosphine manufactured by Hokko Chemical Industry Co., Ltd., 1.13 parts by weight of OP wax manufactured by Hoechst Marion Russell, 1.13 parts by weight of carbon black manufactured by Mitsubishi Chemical Corporation, and 820.0 parts by weight of fused silica (Silstar M2430, manufactured by Nippon Chemical Industrial Co., Ltd.). The mixture was kneaded at 80° C. to 85° C. for seven minutes with a hot twin-screw roll. The resulting mixture was peeled off from the roll, cooled, and then crushed, whereby an epoxy resin sealant was prepared.

An 80-pin flat package having the following chip thereon was prepared by a transfer molding process using the sealant: a test silicon chip, equipped with aluminum wires having a width of 10 µm and a thickness of 1 µm, having dimensions of 6 mm×6 mm×0.4 mm. The flat package had external dimensions of 19 mm×14 mm×2.7 mm.

What is claimed is:

1. A phosphorus-containing epoxy resin comprising:
   a structural unit derived from a secondary phosphine derivative represented by the following formula:

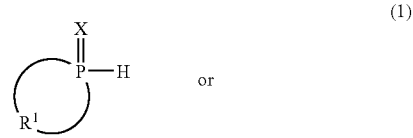

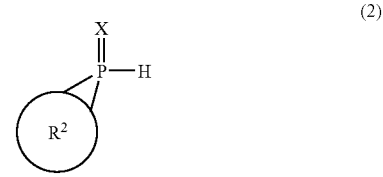

wherein $R^1$ represents an alkylene group that optionally has a substituent, $R^2$ represents a cycloalkylene or arylene group that optionally has a substituent, and X represents an oxygen or sulfur atom.

2. The phosphorus-containing epoxy resin according to claim 1, wherein the secondary phosphine derivative is at least one the group consisting of 1, 4-cyclooctylenephosphine oxide and 1, 5-cyclooctylenephosphine oxide.

3. The phosphorus-containing epoxy resin according to claim 1, wherein the secondary phosphine derivative is allowed to react with an epoxy or polyepoxy compound, whereby the resin is obtained.

4. The phosphorus-containing epoxy resin according to claim 1, wherein the phosphorus content is 0.1 percent to 10 percent by weight.

5. A phosphorus-containing epoxy resin composition comprising:

a phosphorus-containing epoxy resin including:

a structural unit derived from a secondary phosphine derivative represented by the following formula:

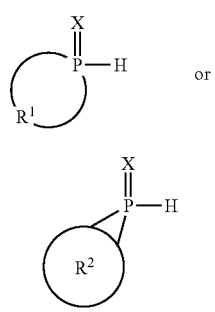

wherein $R^1$ represents an alkylene group that optionally has substituent, $R^2$ represents a cycloalkylene or arylene group that optionally has a substituent, and X represents an oxygen or sulfur atom; and a curing agent or a polymerization initiator.

6. A process for producing a phosphorus-containing epoxy resin comprising the steps of:

providing an epoxy or polyepoxy compound; and reacting the epoxy or polyepoxy compound with a secondary phosphine derivative represented by the following formula:

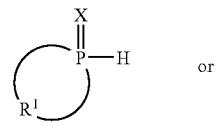

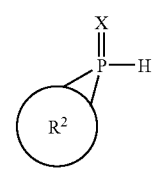

wherein $R^1$ represents an alkylene group that optionally has a substituent, $R^2$ represents a cycloalkylene or arylene group that optionally has a substituent, and X represents an oxygen or sulfur atom.

7. A sealant containing the phosphorus-containing epoxy resin composition according to claim 5.

8. A molding material containing the phosphorus-containing epoxy resin composition according to claim 5.

9. A laminate containing the phosphorus-containing epoxy resin composition according to claim 5.

10. The phosphorus-containing epoxy resin according to claim 2, wherein the secondary phosphine derivative is allowed to react with an epoxy or polyepoxy compound, whereby the resin is obtained.

11. The phosphorus-containing epoxy resin according to claim 10, wherein the phosphorus content is 0.1 percent to 10 percent by weight.

12. The phosphorus-containing epoxy resin according to claim 2, wherein the phosphorus content is 0.1 percent to 10 percent by weight.

13. The phosphorus-containing epoxy resin according to claim 3, wherein the phosphorus content is 0.1 percent to 10 percent by weight.

* * * * *